United States Patent
Reznik et al.

(10) Patent No.: US 6,775,045 B2
(45) Date of Patent: Aug. 10, 2004

(54) OPTOELECTRONIC MODULE

(75) Inventors: Daniel Reznik, Berlin (DE); Maryam Vakilzadeh Moghaddam, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/379,989

(22) Filed: Mar. 5, 2003

(65) Prior Publication Data

US 2003/0169475 A1 Sep. 11, 2003

(30) Foreign Application Priority Data

Mar. 5, 2002 (DE) .......................................... 102 10 533

(51) Int. Cl.$^7$ .............................. G02F 1/03; G02F 1/00; H01S 3/00
(52) U.S. Cl. ...................... 359/254; 359/248; 359/237; 359/245; 372/38.02
(58) Field of Search ................................. 359/254, 245, 359/247, 248, 237; 385/14, 16, 24, 1; 257/80, 84, 435; 250/227.24, 227.11; 333/33, 34, 263, 1; 372/38.02

(56) References Cited

U.S. PATENT DOCUMENTS

| | | | |
|---|---|---|---|
| 5,200,719 A | * | 4/1993 | Margulis et al. ............... 333/34 |
| 5,519,363 A | | 5/1996 | Boudreau et al. ............... 333/1 |
| 6,101,295 A | * | 8/2000 | Mineo et al. .................... 385/1 |
| 6,611,541 B2 | * | 8/2003 | Rookes et al. ........... 372/38.02 |

FOREIGN PATENT DOCUMENTS

EP   0 366 472 A2   5/1990

* cited by examiner

*Primary Examiner*—Georgia Epps
*Assistant Examiner*—Jack Dinh
(74) *Attorney, Agent, or Firm*—Laurence A. Greenberg; Werner H. Stemer; Ralph E. Locher

(57) ABSTRACT

An optoelectronic module has a laser diode configured on a substrate. The laser diode is drivable using an electronic drive device. At least one electrode of the laser diode is connected or coupled to the substrate. In order to match the impedance of the laser diode to the assigned electronic drive device, the substrate is designed as an electric line coupled to one electrode of the laser diode, and the impedance is matched by setting the specific electric conduction properties of the substrate. In this way, in addition to the mechanical function as carrier of the laser diode and the thermal function of dissipating the heat produced in the laser diode, the substrate additionally fulfills an electric function of impedance matching between the laser diode and the assigned electronic drive system. The optoelectronic module therefore offers improved EMC properties.

17 Claims, 2 Drawing Sheets

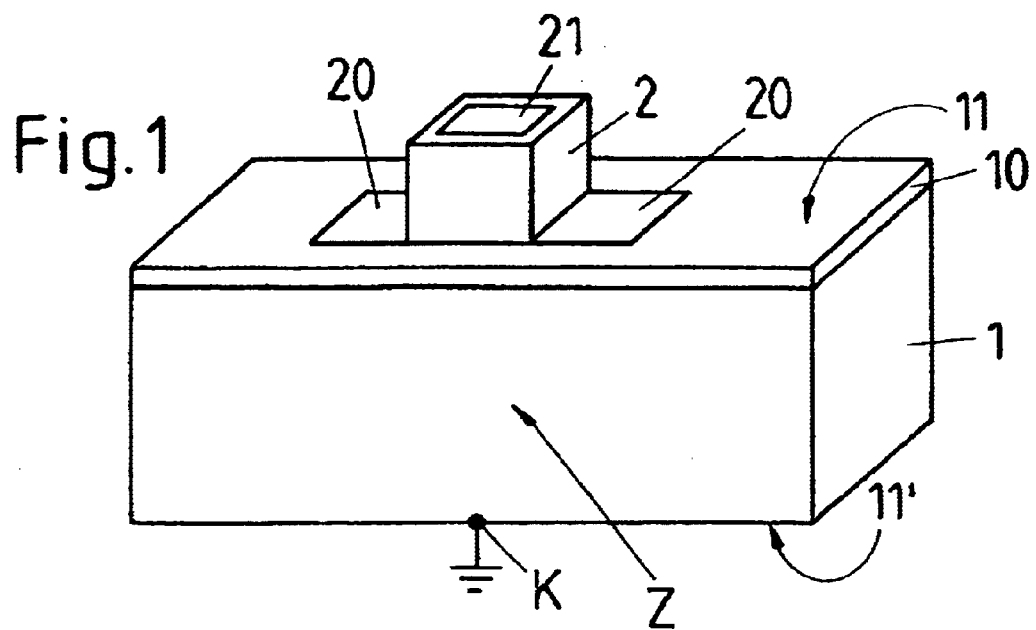
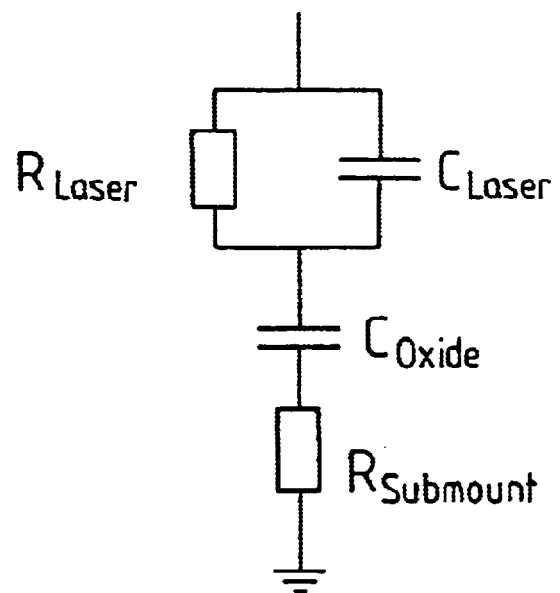

OPTOELECTRONIC MODULE

BACKGROUND OF THE INVENTION

FIELD OF THE INVENTION

The invention relates to an optoelectronic module having a laser diode configured on a substrate. The laser diode can be driven using an electronic drive device. In this case, at least one electrode of the laser diode is connected to the substrate or is coupled to the substrate. That is to say, one electrode is arranged on the substrate itself or is coupled to the substrate via an electric line.

Given high data rates in the gigahertz range, an important role is assumed by the aspect of the high-frequency link between the laser diode and the assigned electronic drive system. In particular, edge-emitting laser diodes are distinguished mostly by a small internal impedance in the order of magnitude of 1–10 ohms. In contrast, the integrated circuits for driving the laser diode mostly have the technically customary output impedance of approximately 50 ohms. The supply leads are also correspondingly designed for a line impedance of 50 ohms.

Moreover, the link between the high-frequency signals and ground potential plays an important role. Frequently, the ground potential of the high-frequency signal referenced to the substrate is connected to the ground potential of the housing via a comparatively long electrically conducting connection, or this connection is completely absent.

Both the differences in impedance between the electronic drive system and the laser diode, and the poor or missing link between the high-frequency signals and the ground potential work out as mismatching. Consequently, the high-frequency signals generated in the electronic drive system are retroreflected to a considerable degree, in particular by the laser diode, and are therefore not available for the electrooptic modulation of the laser diode. This can lead to a substantial worsening of the signal integrity and/or worsen the reflected components of the high-frequency signal, and the electromagnetic compatibility (EMC) of the optoelectronic module with surrounding electronic components.

It is known from the prior art to increase the output power of the electronic drive system in the event of mismatching between the electronic drive system and the laser diode in such a way that an adequate modulation of the laser diode is achieved despite the partial reflection of the high-frequency drive signal. The EMC problems have to be solved in such cases by expensive shielding measures.

SUMMARY OF THE INVENTION

It is accordingly an object of the invention to provide an optoelectronic module and an optoelectronic transceiver, which overcome the above-mentioned disadvantages of the prior art apparatus of this general type in a simple and cost-effective way.

With the foregoing and other objects in view there is provided, in accordance with the invention, an optoelectronic module including: a substrate; and a laser diode for being driven using an electronic drive device. The laser diode is configured on the substrate. The laser diode has an impedance and at least one electrode connected or coupled to the substrate. The substrate has specific electrical conduction properties. For matching the impedance of the laser diode to the electronic drive device, the substrate is designed as an electric line coupled to the electrode of the laser diode, and the impedance of the laser diode is matched by setting the specific electrical conduction properties of the substrate.

In accordance with an added feature of the invention, the substrate includes a semiconductor material.

In accordance with an additional feature of the invention, an electric contact is provided for applying a defined electric potential to the substrate. The electric contact is configured on the substrate at a spacing from the electrode. The substrate has a conduction region between the electrode of the laser diode and the electric contact of the substrate. The specific electrical conduction properties of the substrate are properties in the conduction region. During operation of the laser diode, the specific electrical conduction properties of the substrate match the impedance of the laser diode to that of the electronic drive device.

In accordance with another feature of the invention, the substrate has a resistivity; and the substrate has a semiconductor material with a doping determining the resistivity of the substrate.

In accordance with a further feature of the invention, the substrate has an electrically insulating section in the conduction region; the substrate has a capacitive reactance in the conduction region; and the electrically insulating section has dimensions influencing the capacitive reactance in the conduction region.

In accordance with a further added feature of the invention, the substrate has a first surface and a second surface; the electrode and the laser diode are configured on the first surface; and the electric contact is configured on the second surface of the substrate.

In accordance with a further additional feature of the invention, the substrate has a planar design; and the first surface of the substrate is configured opposite the second surface of the substrate.

In accordance with yet an added feature of the invention, the electrically insulating section is formed as an electrically insulating layer on at least one surface selected from a group consisting of the first surface and the second surface.

In accordance with yet an additional feature of the invention, the electrically insulating layer is an $SiO_2$ layer.

In accordance with yet another feature of the invention, the electrically insulating section is formed as an electrically insulating layer on the first surface.

In accordance with yet a further feature of the invention, the electrode of the laser diode is configured on the electrically insulating layer.

In accordance with another added feature of the invention, the substrate has a first surface and a second surface; the electrode and the laser diode are configured on the first surface; and the electric contact is configured on the second surface of the substrate.

With the foregoing and other objects in view there is also provided, in accordance with the invention, an optoelectronic transceiver that includes the an optoelectronic module.

In order to inventively match the impedance of the laser diode to the assigned electronic drive device, the substrate is designed as an electric line coupled to one electrode of the laser diode, and the impedance is matched by setting the specific electric conduction properties of the substrate.

In this way, in addition to the mechanical function as carrier of the laser diode and the thermal function of dissipating the heat produced in the laser diode, the substrate additionally fulfills an electric function of impedance matching between the laser diode and the assigned electronic drive system. This ensures a better utilization of the electric drive signal of the electronic drive system by the laser diode. Furthermore, the optoelectronic module has improved EMC properties.

The inventive solution utilizes the fact that the substrate can be designed with specific electrical conduction properties, that is to say defined ohmic, capacitive and/or inductive impedance components, in such a way that the total impedance of laser diode and the substrate is matched to the impedance of the electronic drive system.

The inventive solution is simple and cost effective, since for impedance matching, an already present and required component, specifically the carrier substrate of the laser diode, is used. Additional functions are provided thereby in conjunction with the same number of parts.

It is preferred for a defined electric potential to be applied to the substrate via an electric contact that is arranged on the substrate at a spacing from one electrode. As previously described, in a conduction region of the substrate material that extends between one electrode of the laser diode and the electric contact, the substrate has specific electrical conduction properties that serve during the operation of the laser diode to match the impedance to the assigned electronic drive device.

It is advantageous when the substrate has a semiconductor material. In particular, using a doped semiconductor material permits the ohmic resistivity of the substrate to be set accurately via the selection of different dopants and dopant concentrations.

The substrate is preferably designed with an electrically insulating section in the conduction region. As a result, the capacitive reactance component of the substrate in the conduction region can be influenced in a simple way by the dimensions of the electrically insulating section.

On the substrate, one electrode of the laser diode is preferably arranged on a first surface of the substrate, and the electric contact of the substrate is arranged on a second surface of the substrate. By suitably selecting the spacing between one electrode of the laser diode and the electric contact of the substrate, it is possible to set the ohmic resistance of the conduction region together with the parameter of the specific conductance of the substrate in the conduction region.

Given a planar design of the substrate, for example, as a silicon wafer, the first surface and the second surface are assigned to the two opposite side faces of the substrate.

The electrically insulating section is preferably designed as an electrically insulating layer that at least partially forms the first and/or the second surface of the substrate.

In a preferred embodiment, the substrate has an electrically insulating layer on the first surface, and one electrode of the laser diode is arranged on this electrically insulating layer.

Particularly in the case of a silicon substrate, the electrically insulating layer can be designed simply as a thin silicon dioxide layer.

Other features which are considered as characteristic for the invention are set forth in the appended claims.

Although the invention is illustrated and described herein as embodied in an optoelectronic module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a perspective view (not to scale) of an exemplary embodiment of the optoelectronic module;

FIG. 2 is an equivalent circuit diagram of the optoelectronic module shown in FIG. 1.

DESCRIPTION OF THE PREFERRED EMBODIMENTS

Figure 3:
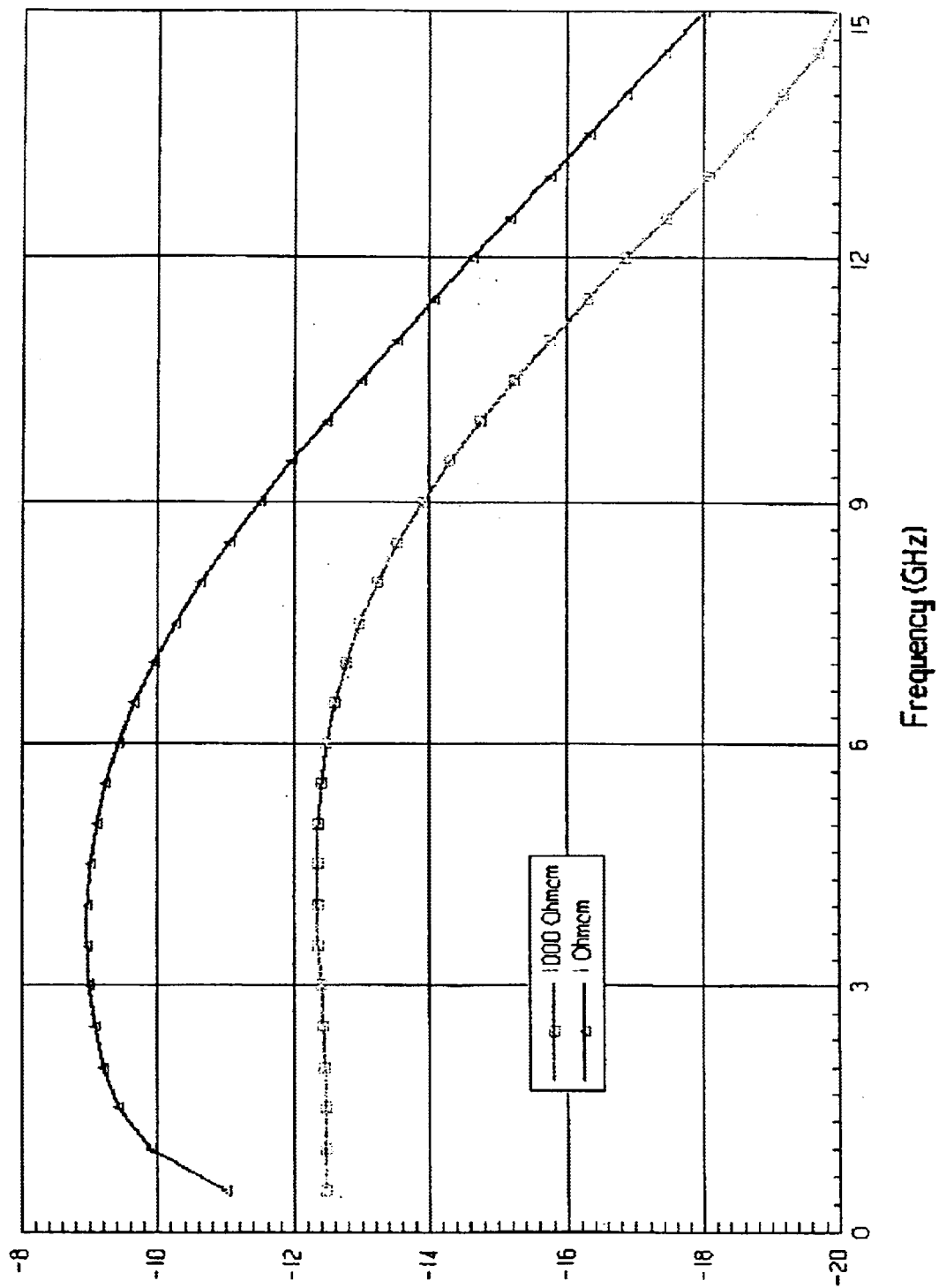
FIG. 3 is a graph of the simulated transmission properties of inventive optoelectronic modules as a function of the drive frequency for substrates of different specific conductance.

Referring now to the figures of the drawing in detail and first, particularly, to FIG. 1 thereof, there is shown a perspective view (not to scale) of an embodiment of the optoelectronic module. In this case, the laser diode 2 is arranged on the first surface 11 of the planar substrate 1. The laser diode can be any desired laser diode, for example, an edge-emitting or a vertically emitting laser diode.

The laser diode 2 has two electrodes 20, 21. One electrode 20 is arranged between the laser diode 2 and the first surface 11 of the substrate 1 and extends on the first surface 11 of the substrate 1 on both sides of the laser diode 2. In this embodiment of the optoelectronic module, one electrode 20 of the laser module 2 constitutes the cathode. Consequently, one electrode 20 is also denoted below as a cathode pad 20.

The other electrode 21 is arranged as an anode pad on the surface of the laser diode 2 averted from the substrate 1.

On its first surface 11, the substrate 1 has an electrically non-conducting thin layer 10. This thin layer 10 can be applied to the substrate 1 using all known methods of thin-film technology such as, for example, sputtering, PECVD (Plasma Enhanced Chemical Vapor Deposition) and LPCVD (Low Pressure Chemical Vapor Deposition).

It is particularly simple and cost-effective given the use of a silicon substrate 1 to have the thin layer 10 grow on a substrate surface from the substrate material itself as a silicon oxide layer, for example, by using a so-called wet oxidation process. These thin layers usually have layer thicknesses in the region of up to 2 $\mu$m. CVD (Chemical Vapor Deposition) methods for depositing layers are customarily used if greater layer thicknesses are required.

On the second surface 11', which is opposite the first surface 11, the substrate 1 has an electric contact K that is connected to ground potential.

Consequently, between the cathode pad 20 and the electric contact K the substrate 1 has a conduction region Z that acts as an electric line. The specific electric conduction parameters of the conduction region Z contribute to the total impedance of laser diode 2 and substrate 1.

In the present exemplary embodiment, the specific conduction properties of the substrate 1 in the conduction region Z comprise, on the one hand, an ohmic resistance component that is defined by the specific conductance of the substrate 1 in the conduction region Z and the geometric spacing between the electric contact K and the cathode pad 20 and, on the other hand, a capacitive reactance component that is determined by the layer thickness of the electrically insulating thin layer 10 and the geometric configuration of the cathode pad 20. It therefore holds that the layer thickness of the thin layer 10 linearly influences the magnitude of the capacitive reactance component.

For the present exemplary embodiment, three parameters of specific conductance of the substrate 1, layer thickness of the thin layer 10 and geometric shaping of the cathode pad 20 are freely selectable within certain bounds. It is possible in this way to match the impedance of the laser diode/substrate system flexibly to the assigned electronic drive system.

It goes without saying that other than as illustrated in FIG. 1, a multiplicity of geometries are possible for the arrangement of the cathode pad 20 and the electric contact K on the substrate 1. All that is essential in each case is that the substrate material arranged between the cathode pad 20 and the electric contact K in the so-called conduction region Z has AC conduction properties whose additional impedance components serve to match the impedance of the laser diode/substrate system to the assigned electronic drive system.

FIG. 2 shows an electric equivalent circuit of the optoelectronic module illustrated in FIG. 1.

As previously described, the ohmic resistance $R_{submount}$ of the substrate and the capacitive reactance component $C_{oxide}$ influenced by the thin layer and the cathode pad 20 can be set freely within prescribed limits.

In particular, the ohmic resistance $R_{submount}$ of the substrate 1 is set via a suitable doping of the substrate and the spacing between one electrode 20 and the electric contact K of the substrate 1.

The capacitive reactance component $C_{oxide}$ is set via the layer thickness and/or the layer material of the electrically insulating layer 10 and the geometry of the cathode pad 20.

The total impedance of the laser diode 2 and the substrate 1 is therefore obtained from a series circuit of the ohmic resistance component $R_{submount}$ of the substrate and the capacitive reactance component $C_{oxide}$ of the substrate with the parallel circuit of the ohmic resistance component $R_{laser}$ of the laser diode 2 and the capacitive reactance component $C_{laser}$ of the laser diode 2.

The substrate 1 therefore fulfills the electric function of an additional R-C circuit of the ohmic resistance component $R_{laser}$ and the capacitive reactance component $C_{laser}$ of the laser diode 2.

FIG. 3 shows the simulated transmission curves of a first and a second optoelectronic module in a TO-46 housing. The signal strength Magnitude in dB is plotted in each case against the Frequency of the test signal in GHz. The greater the transmission of the test signal, the fewer components of the test signal are reflected, because of mismatching of the impedance between the electronic drive system and laser diode. Consequently, the transmission is a measure of the desired impedance matching between electronic drive system and laser diode.

The upper of the two transmission curves is assigned to a first optoelectronic module whose substrate has a specific conductance of 1 ohmcm. This transmission curve runs in the region of a signal frequency of 4 GHz in a wide maximum. In this region, the first optoelectronic module has a transmission that is better by approximately 3 dB in comparison with the second optoelectronic module, which is assigned to the second transmission curve and has a substrate with a specific conductance of 1000 ohmcm.

Consequently, because of the higher specific conductance of the substrate, the first optoelectronic module is substantially better matched to the impedance of the electronic drive system, and is particularly well suited to data transmission rates in the region of 8 Gbit/s.

As already explained previously, the transmission properties of the exemplary embodiment illustrated in FIG. 1 of an optoelectronic module can be optimized by the well-calculated matching of the specific conductance of the substrate 1, the layer thickness of the electrically insulating layer 10, and by the geometric layout of the cathode pad 20.

In further exemplary embodiments (not illustrated), the electrically insulating or capacitive layer is arranged on the underside of the substrate. Again, the substrate need not be constructed monolithically, but can be assembled in a hybrid design from subregions of possibly different doping and/or material.

We claim:

1. An optoelectronic module, comprising:
   a substrate; and
   a laser diode for being driven using an electronic drive device;
   said laser diode configured on said substrate;
   said laser diode having an impedance and at least one electrode connected or coupled to said substrate;
   said substrate having specific electrical conduction properties; and
   for matching said impedance of said laser diode to the electronic drive device, said substrate being designed as an electric line coupled to said electrode of said laser diode, and said impedance of said laser diode being matched by setting said specific electrical conduction properties of said substrate.

2. The optoelectronic module according to claim 1, wherein said substrate includes a semiconductor material.

3. The optoelectronic module according to claim 1, further comprising:
   an electric contact for applying a defined electric potential to said substrate;
   said electric contact configured on said substrate at a spacing from said electrode;
   said substrate having a conduction region between said electrode of said laser diode and said electric contact of said substrate;
   said specific electrical conduction properties of said substrate being properties in said conduction region; and
   during operation of said laser diode, said specific electrical conduction properties of said substrate matching said impedance of said laser diode to the electronic drive device.

4. The optoelectronic module according to claim 3, wherein:
   said substrate has a resistivity; and
   said substrate has a semiconductor material with a doping determining said resistivity of said substrate.

5. The optoelectronic module according to claim 3, wherein:
   said substrate has an electrically insulating section in said conduction region;
   said substrate has a capacitive reactance in said conduction region; and
   said electrically insulating section has dimensions influencing said capacitive reactance in said conduction region.

6. The optoelectronic module according to claim 5, wherein:
   said substrate has a first surface and a second surface;
   said electrode and said laser diode are configured on said first surface; and said electric contact is configured on said second surface of said substrate.

7. The optoelectronic module according to claim 6, wherein said electrically insulating section is formed as an electrically insulating layer on at least one surface selected from a group consisting of said first surface and said second surface.

8. The optoelectronic module according to claim 7, wherein said electrically insulating layer is an $SiO_2$ layer.

9. The optoelectronic module according to claim 6, wherein said electrically insulating section is formed as an electrically insulating layer on said first surface.

10. The optoelectronic module according to claim 9, wherein said electrode of said laser diode is configured on said electrically insulating layer.

11. The optoelectronic module according to claim 6, wherein:

said substrate has a planar design; and said first surface of said substrate is configured opposite said second surface of said substrate.

12. The optoelectronic module according to claim 11, wherein said electrically insulating section is formed as an electrically insulating layer on at least one surface selected from a group consisting of said first surface and said second surface.

13. The optoelectronic module according to claim 12, wherein said electrically insulating layer is an $SiO_2$ layer.

14. The optoelectronic module according to claim 11, wherein said electrically insulating section is formed as an electrically insulating layer on said first surface.

15. The optoelectronic module according to claim 11, wherein said electrode of said laser diode is configured on said electrically insulating layer.

16. The optoelectronic module according to claim 3, wherein:

said substrate has a first surface and a second surface;

said electrode and said laser diode are configured on said first surface; and said electric contact is configured on said second surface of said substrate.

17. An optoelectronic transceiver, comprising:

an optoelectronic module including a substrate and a laser diode for being driven using an electronic drive device;

said laser diode configured on said substrate;

said laser diode having an impedance and at least one electrode connected or coupled to said substrate;

said substrate having specific electrical conduction properties; and for matching said impedance of said laser diode to the electronic drive device, said substrate being designed as an electric line coupled to said electrode of said laser diode, and said impedance of said laser diode being matched by setting said specific electrical conduction properties of said substrate.

* * * * *